(12) United States Patent
Haddad et al.

(10) Patent No.: US 7,269,057 B2
(45) Date of Patent: Sep. 11, 2007

(54) METHOD FOR CONNECTING CIRCUIT ELEMENTS WITHIN AN INTEGRATED CIRCUIT FOR REDUCING SINGLE-EVENT UPSETS

(75) Inventors: Nadim F. Haddad, Oakton, VA (US); Neil E. Wood, Centreville, VA (US); Adam Bumgarner, Woodbridge, VA (US); Wayne Neiderer, Manassas, VA (US); Shankarnarayana Ramaswamy, Chantilly, VA (US); Scott Doyle, Centreville, VA (US); Tri-Minh Hoang, Clifton, VA (US)

(73) Assignee: BAE Systems Information And Electronic Systems Integration Inc., Nashua, NH (US)

( * ) Notice: Subject to any disclaimer, the term of this patent is extended or adjusted under 35 U.S.C. 154(b) by 240 days.

(21) Appl. No.: 11/116,024

(22) Filed: Apr. 27, 2005

(65) Prior Publication Data

US 2006/0245124 A1 Nov. 2, 2006

(51) Int. Cl.
*G11C 11/00* (2006.01)

(52) U.S. Cl. .................. 365/156; 365/154; 257/903
(58) Field of Classification Search ............. 365/156
See application file for complete search history.

(56) References Cited

U.S. PATENT DOCUMENTS

| | | | | | |
|---|---|---|---|---|---|
| 5,157,625 | A | * | 10/1992 | Barry | 365/154 |
| 5,311,070 | A | * | 5/1994 | Dooley | 327/208 |
| 6,058,041 | A | * | 5/2000 | Golke et al. | 365/156 |
| 6,180,984 | B1 | * | 1/2001 | Golke et al. | 257/347 |
| 6,259,643 | B1 | * | 7/2001 | Li | 365/206 |
| 6,573,773 | B2 | * | 6/2003 | Maki et al. | 327/200 |
| 6,975,041 | B2 | * | 12/2005 | Hirano et al. | 257/393 |
| 7,139,190 | B1 | * | 11/2006 | de Jong | 365/154 |
| 2006/0133134 | A1 | * | 6/2006 | Doyle et al. | 365/154 |

* cited by examiner

*Primary Examiner*—Son L. Mai
(74) *Attorney, Agent, or Firm*—Dillon & Yudell LLP

(57) ABSTRACT

A method for connecting circuit elements within an integrated circuit for reducing single-event upsets is disclosed. The integrated circuit includes a first and second circuit elements that are substantially identical to each other. In order to reduce the single-event upsets to the first and second circuit elements, each of the first and second circuit elements is divided into a first sub-element and a second sub-element. The first sub-element of the first circuit element is connected to the second sub-element of the second circuit element. The second sub-element of the first circuit element is connected to the first sub-element of the second circuit element. As a result, the nodal spacings between the sub-elements within the first and second circuit elements are effectively increased without demanding additional real estate.

9 Claims, 2 Drawing Sheets

METHOD FOR CONNECTING CIRCUIT ELEMENTS WITHIN AN INTEGRATED CIRCUIT FOR REDUCING SINGLE-EVENT UPSETS

The present invention was made under government contract DSWA01-96-C-0106.

BACKGROUND OF THE INVENTION

1. Technical Field

The present invention relates to integrated circuits in general, and in particular to an integrated circuit having multiple repeatable circuit elements. Still more particularly, the present invention relates to a method for connecting repeatable circuit elements within an integrated circuit for reducing single-event upsets.

2. Description of Related Art

In certain environments, such as satellite orbital space, in which the level of radiation is relatively intense, integrated circuits are more susceptible to single-event upsets (SEUs) or soft errors than they would have otherwise in terrestrial environments. SEUs are typically caused by electron-hole pairs generated by a single energetic particle as the single energetic particle passes through various circuit elements within an integrated circuit. If the energetic particle generates a critical amount of charges in a node of a circuit element within the integrated circuit, the logic state of the node will be upset.

As technology scales to smaller geometries, the sizes of circuit elements within integrated circuit also become smaller. As a result, the spacing between nodes within a circuit element is reduced to a level that allows charges deposited from a single-event hit to be collected simultaneously by two nodes within an circuit element. Such phenomenon creates a special sensitivity that drastically reduces the effectiveness of SEU hardened circuits. The problem of simultaneously collection of charges by two nodes cannot be resolved simply by increasing of the nodal spacing because it will defect the advantages of technology scaling in achieving higher density integrated circuits.

Consequently, it would be desirable to provide an improved method for connecting circuit elements within an integrated circuits for reducing SEUs.

SUMMARY OF THE INVENTION

In accordance with a preferred embodiment of the present invention, an integrated circuit includes a first and second circuit elements that are substantially identical to each other. In order to reduce the single-event upsets to the first and second circuit elements, each of the first and second circuit elements is divided into a first sub-element and a second sub-element. The first sub-element of the first circuit element is connected to the second sub-element of the second circuit element. The second sub-element of the first circuit element is connected to the first sub-element of the second circuit element. As a result, the nodal spacings between the sub-elements within the first and second circuit elements are effectively increased without demanding additional real estate.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is illustrated by using a static random-access memory (SRAM) having multiple storage cells. However, it is understood by those skilled in the art that the present invention is also applicable to any integrated circuits that employ multiple identical circuit elements.

Figure 1:
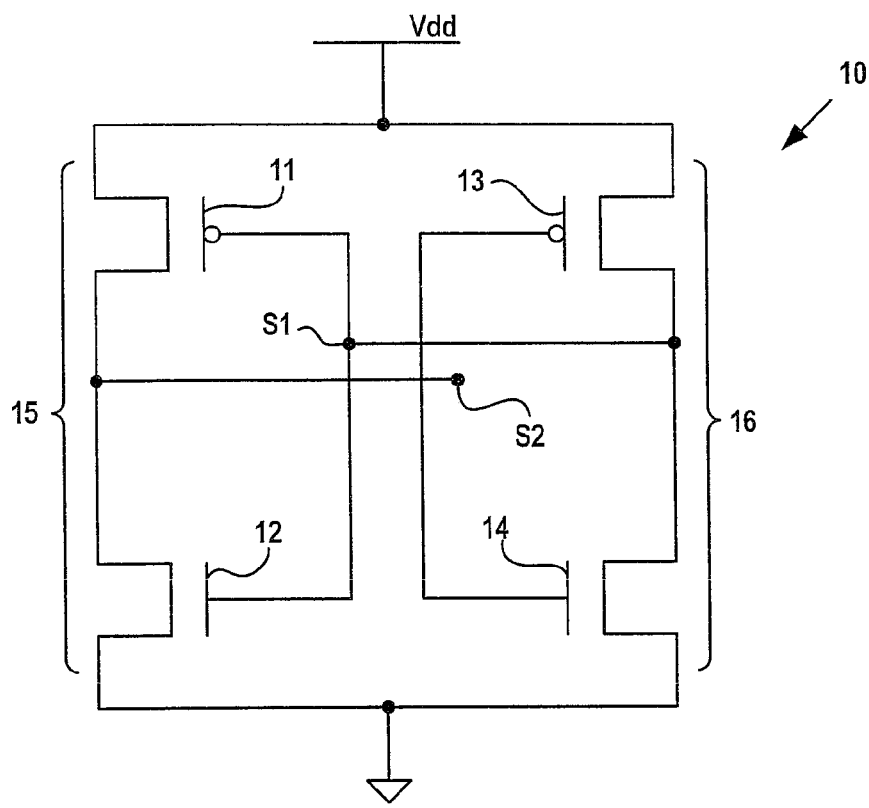
FIG. 1 is a schematic diagram of a conventional storage cell that is commonly found in static random access memories (SRAMs)

Referring now to the drawings and in particular to FIG. 1, there is illustrated a schematic diagram of a conventional storage cell that is commonly found in SRAMs. As shown, a storage cell 10 is constructed with two cross-coupled complementary metal-oxide semiconductor (CMOS) inverters 15 and 16. Inverter 15 includes a p-channel transistor 11 and an n-channel transistor 12; and inverter 16 includes a p-channel transistor 13 and an n-channel transistor 14. The gates of transistors 11-12 are both connected to a node between transistors 13 and 14 to form a storage node S1. The gates of transistors 13-14 are both connected to a node between transistors 11 and 12 to form a storage node S2. Because of the cross-coupling of inverters 15 and 16, the voltages on storage nodes S1 and S2 are logical complements of one another during operation.

The logic state of storage cell 10 can be changed by a single-event upset (SEU) in many ways. For example, if a single energetic particle, such as an alpha particle, strikes the drain of transistor 11 of inverter 15, electrons will diffuse towards a power supply $V_{dd}$ of inverter 15, and holes collected at the drain of transistor 11 will change the output voltage of inverter 15 at storage node S2 from a logic high to a logic low when transistor 11 is turned off while transistor 12 is turned on. However, if the alpha particle strikes the drain of transistor 12 of inverter 15, holes will drift towards ground, and electrons collected at the drain of transistor 11 will change the output voltage of inverter 15 at storage node S2 from a logic low to a logic high when transistor 11 is turned on while transistor 12 is turned off. Because storage cell 10 is susceptible to SEUs, it would be desirable to provide an improved method for interconnecting storage cell 10 to other adjacent storage cells within an SRAM such that all the storage cells within the SRAM are more SEU tolerant.

Figure 2:
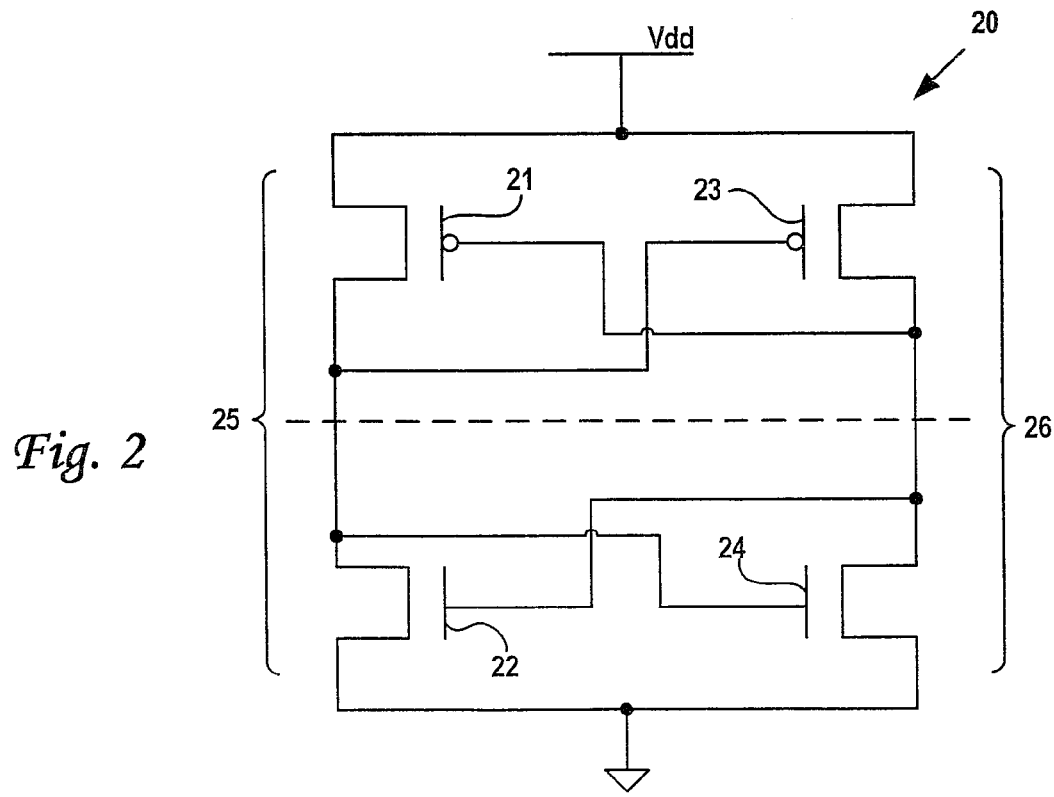
FIG. 2 is a schematic diagram of an SRAM storage cell, in accordance with a preferred embodiment of the present invention.

With reference now to FIG. 2, there is illustrated a schematic diagram of a SRAM storage cell, in accordance with a preferred embodiment of the present invention. As shown, a storage cell 20 has two cross-coupled CMOS inverters 25 and 26. Inverter 25 is formed by a p-channel transistor 21 and an n-channel transistor 22; and inverter 26 is formed by p-channel transistor 23 and an n-channel transistor 24.

From a functional standpoint, storage cell 20 is identical to storage cell 10 11 from FIG. 1. But the physical interconnections among transistors 21-24 are different from the physical interconnections among transistors 11-14 from FIG. 1. In the present embodiment, the gate of transistor 21 and the gate of transistor 22 are separately connected to the drains of transistors 23 and 24, respectively. Similarly, the gate of transistor 23 and the gate of transistor 24 are separately connected to the drains of transistors 21 and 22, respectively. As such, storage cell 20 can be divided into two separate sub-cells, namely, a first sub-cell and a second sub-cell. The points of divisions between the first sub-cell and the second sub-cell are shown by a dashed line across the middle of storage cell 20. Thus, the first sub-cell includes transistors 21 and 23; and the second sub-cell includes transistors 22 and 24.

Figure 3:
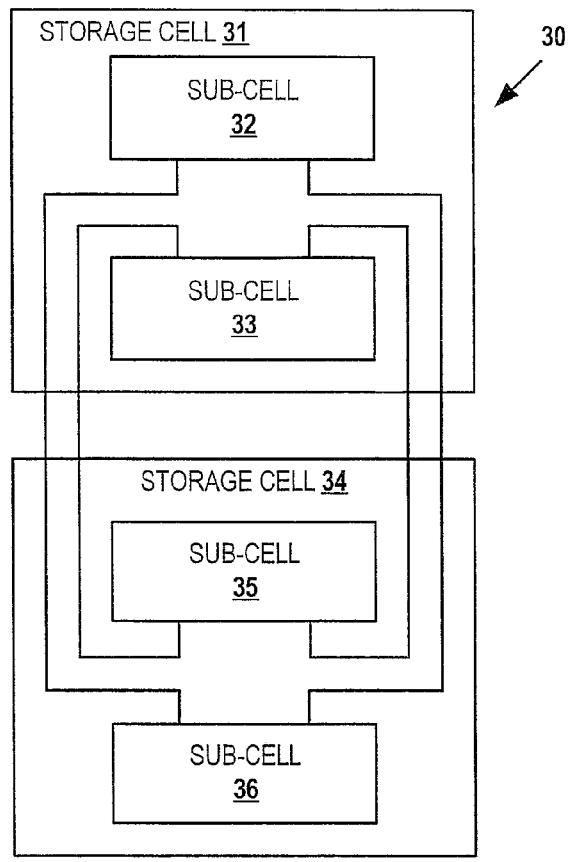
FIG. 3 is a block diagram of two SRAM storage cells having inter-connections according to a preferred embodiment of the present invention.

The division of storage cell 20 into two separate sub-cells allows storage cell 20 to be connected to other adjacent storage cells with increased nodal spacings while without occupying additional spaces on an SRAM device. Referring now to FIG. 3, there is depicted a block diagram of a single array of storage cells having interconnections according to a preferred embodiment of the present invention. As shown, an array 30 includes a storage cell 31 and a storage cell 34. Storage cell 31 is located at one adjacent end of storage cell 34. Storage cell 31 includes a sub-cell 32 and a sub-cell 33. Similarly, storage cell 34 includes a sub-cell 35 and a sub-cell 36. The sub-cells within each of storage cells 31 and 32 are divided in the same manner as the sub-cells within storage cell 20 from FIG. 2.

As a preferred embodiment of the present invention, sub-cell 32 of storage cell 31 is connected to sub-cell 36 of storage cell 34, and sub-cell 33 of storage cell 31 is connected to sub-cell 35 of storage cell 34. Specifically, the drains of the two transistors that form the cross-coupled inverters in sub-cell 32 are connected to the drains of the two transistors that form the cross-coupled inverters in sub-cell 36. Similarly, the drains of the two transistors that form the cross-coupled inverters in sub-cell 33 are connected to the drains of the two transistors that form the cross-coupled inverters in sub-cell 35.

If the internal nodes of storage cells 31 and 34 were to be connected like storage cell 10 from FIG. 1 (i.e., sub-cell 32 connected to sub-cell 33; sub-cell 35 connected to sub-cell 36), then array 30 would be more susceptible to SEUs. For example, after a heavy ion energetic particle strike, the charges deposit on sub-cells 32 and 33 simultaneously can cause a data upset. Similarly, charges deposit on sub-cells 35 and 36 simultaneously can also cause a data upset.

With the interleaved connections shown in FIG. 3, it is less likely for charges to be deposited on sub-cells 32 and 36 simultaneously to cause a data upset because of the increased nodal spacing between sub-cells 32 and 36. Although the nodal spacing between sub-cells 33 and 35 are not as large as the nodal spacing between sub-cells 32 and 36, it is still larger than the nodal spacing between sub-cells 32 and 33 had they were connected together.

Figure 4:
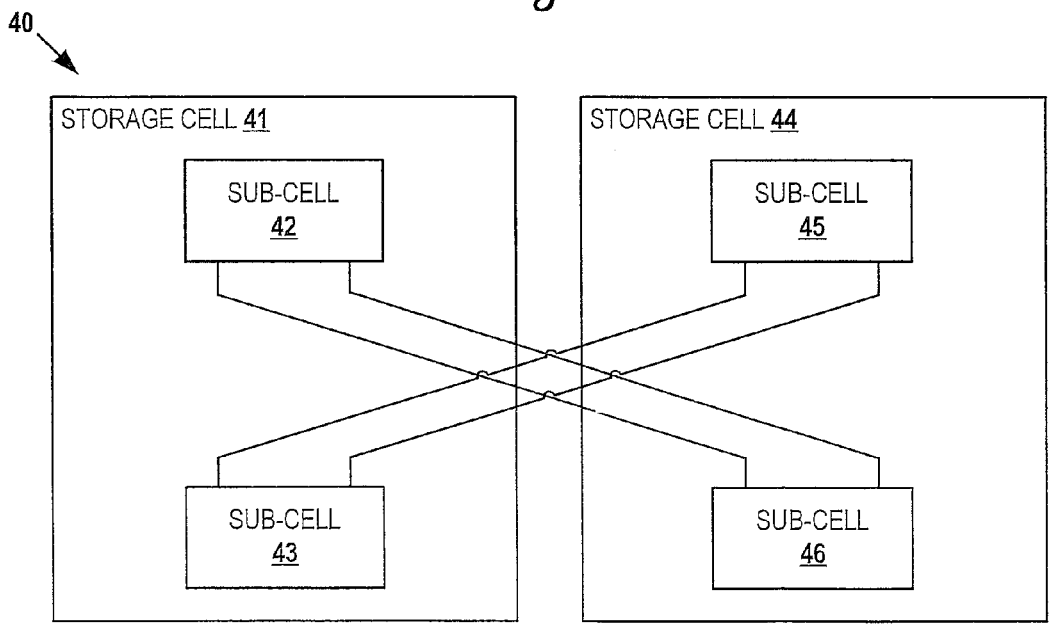
FIG. 4 is a block diagram of two SRAM storage cells having inter-connections according to an alternative embodiment of the present invention.

With reference now to FIG. 4, there is depicted a block diagram of a single array of storage cells having interconnections according to an alternative embodiment of the present invention. As shown, an array 40 includes a storage cell 41 and a storage cell 44. Storage cell 41 is located at one adjacent side of storage cell 44. Storage cell 41 includes a sub-cell 42 and a sub-cell 43. Similarly, storage cell 44 includes a sub-cell 45 and a sub-cell 46. Sub-cell 42 of storage cell 41 is connected to sub-cell 46 of storage cell 44, and sub-cell 43 of storage cell 41 is connected to sub-cell 45 of storage cell 44. Specifically, the drains of the two transistors that form the cross-coupled inverters in sub-cell 42 are connected to the drains of the two transistors that form the cross-coupled inverters in sub-cell 46. Similarly, the drains of the two transistors that form the cross-coupled inverters in sub-cell 43 are connected to the drains of the two transistors that form the cross-coupled inverters in sub-cell 45.

As has been described, the present invention provides a method for connecting repeatable circuit elements within an integrated circuits for reducing SEUs. The method of the present invention allows an increase in the nodal spacing for sensitive nodes while without adding real estate to the entire circuit.

The concept of interleaved connections among sub-cells can be expanded indefinitely to include a 1×4 array, 1×8 array, a 2×2 array, a 2×4 array, an 8×8 array, etc. As semiconductor technologies migrate to smaller geometries, the extension of the present technique to include more internal elements or nodes, and larger array sizes to achieve sufficient spacings will become necessary. This concept can be applied to mitigate commercial "alpha-particle-type" sensitivities as well as radiation hardened applications.

While the invention has been particularly shown and described with reference to a preferred embodiment, it will be understood by those skilled in the art that various changes in form and detail may be made therein without departing from the spirit and scope of the invention.

What is claimed is:

1. A method for connecting circuit elements within an integrated circuit for reducing single-events upsets, said method comprising:
    dividing a first circuit element into a first sub-element and a second sub-element such that said first sub-element of said first circuit element is not connected to said second sub-element of said first circuit element;
    dividing a second circuit element into a first sub-element and a second sub-element such that said first sub-element of said second circuit element is not connected to said second sub-element of said second circuit element, wherein said first and second circuit elements are substantially identical to each other;
    connecting said first sub-element of said first circuit element to said second sub-element of said second circuit element; and
    connecting said second sub-element of said first circuit element to said first sub-element of said second circuit element such that nodal spacings between sub-elements are effectively increased.

2. The method of claim 1, wherein said first circuit element is located at an adjacent end of said second circuit element.

3. The method of claim 1, wherein said first circuit element is located at an adjacent side of said second circuit element.

4. An integrated circuit comprising:
    a first circuit element having a first sub-element and a second sub-element, wherein said first sub-element of said first circuit element is not connected to said second sub-element of said first circuit element;
    a second circuit element having a first sub-element and a second sub-element, wherein said first sub-element of said second circuit element is not connected to said second sub-element of said second circuit element, wherein said first and second circuit elements are substantially identical to each other;
interconnects for connecting said first sub-element of said first circuit element to said second sub-element of said second circuit element; and
interconnects for connecting said second sub-element of said first circuit element to said first sub-element of said second circuit element such that nodal spacings between sub-elements are effectively increased.

5. The integrated circuit of claim 4, wherein said first circuit element is located at an adjacent end of said second circuit element.

6. The integrated circuit of claim 4, wherein said first circuit element is located at an adjacent side of said second circuit element.

7. A static random access memory comprising:
a first circuit element having two p-channel transistors and two n-channel transistors, wherein said two p-channel transistors of said first circuit element are not connected to said two n-channel transistors of said first circuit element;
a second circuit element having two p-channel transistors and two n-channel transistors, wherein said two p-channel transistors of said second circuit element are not connected to said two n-channel transistors of said second circuit element, wherein said first and second circuit elements are substantially identical to each other;
interconnects for connecting said two p-channel transistors of said first circuit element to said two n-channel transistors of said second circuit element; and
interconnects for connecting said two p-channel transistors of said second circuit element to said two n-channel transistors of said first circuit element.

8. The static random access memory of claim 7, wherein said first circuit element is located at an adjacent end of said second circuit element.

9. The static random access memory of claim 7, wherein said first circuit element is located at an adjacent side of said second circuit element.

* * * * *